US005506527A

United States Patent [19]
Rudolph et al.

[11] Patent Number: 5,506,527
[45] Date of Patent: Apr. 9, 1996

[54] LOW POWER DIODE

[75] Inventors: Daniel C. Rudolph; Charles S. Stephens, both of Corvallis, Oreg.

[73] Assignee: Hewlett-Packard Compnay, Palto Alto, Calif.

[21] Appl. No.: 227,935

[22] Filed: Apr. 15, 1994

[51] Int. Cl.$^6$ .............................. G06G 7/12; H03K 3/26
[52] U.S. Cl. ....................... 327/104; 327/561; 327/524; 327/583
[58] Field of Search .................................. 327/563, 427, 327/524, 63, 538, 544, 583, 565, 584, 54, 59, 104, 206, 205, 561

[56] References Cited

U.S. PATENT DOCUMENTS

| | | | |
|---|---|---|---|
| 3,569,739 | 3/1971 | Stolman | 327/88 |
| 4,126,826 | 11/1978 | Dobkin | 327/512 |
| 4,360,746 | 11/1982 | Branson | 322/561 |
| 4,500,798 | 2/1985 | Pike | 327/583 |
| 4,678,947 | 7/1987 | Huijsing et al. | 327/583 |

*Primary Examiner*—Timothy P. Callahan
*Assistant Examiner*—Dunh T. Le
*Attorney, Agent, or Firm*—Curtis G. Rose

[57] ABSTRACT

A common dictionary definition of a "diode" is "any electronic device that restricts current flow chiefly to one direction." This definition covers not only the conventional two lead PN junction semiconductor device presently known in the prior art (referred to herein as a "conventional diode") but also the electronic device of this invention (referred to herein as a "low power diode"). A low power diode has a comparator for comparing the voltage present at the anode and cathode of the diode. When the comparator determines that the voltage present at the anode of the low power diode equals or exceeds the voltage present at the cathode of the low power diode by a predetermined forward voltage, a signal is generated. This signal turns on a transistor acting as a switch, which in turn electronically connects the anode and the cathode of the low power diode together. Unlike conventional diodes that have a forward voltage (dependent on the physical silicon junction property of the diode) of approximately 0.7 Volts, this low power diode has a very small forward voltage (dependent on the drain to source resistance of the switch when on and the offset of the comparator) as low as 0.25 milliVolts.

4 Claims, 7 Drawing Sheets

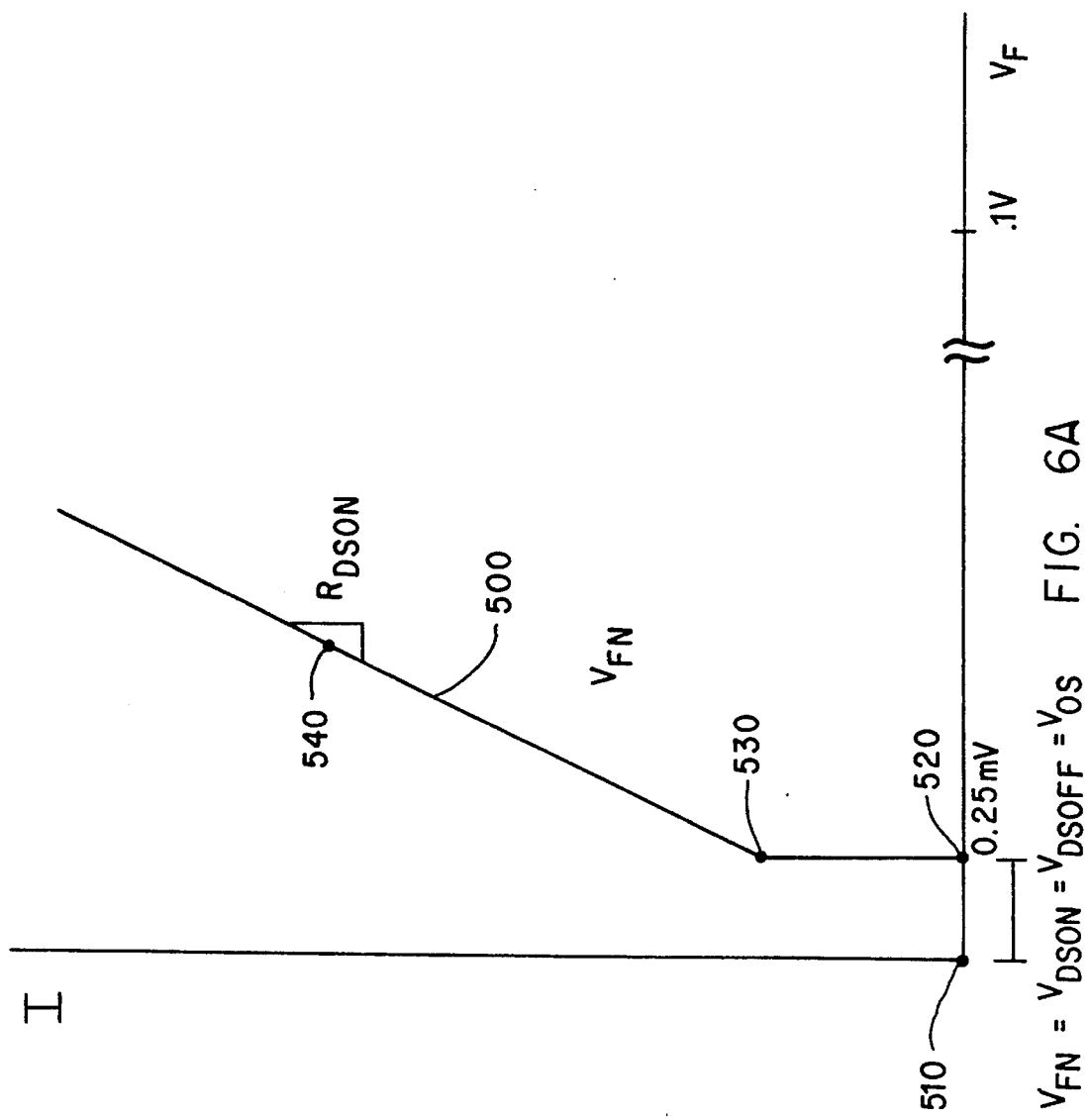

5,506,527

1

LOW POWER DIODE

FIELD OF THE INVENTION

This invention relates to the electronics circuitry field. More particularly, this invention is a diode with low power dissipation.

BACKGROUND OF THE INVENTION

Today's electronic devices, from computers to cars to rockets to watches, are built by connecting together anywhere from a few to millions of electrical components. While complex electronic devices can indeed contain millions of components, only a relatively small number of these components are truly different from other types of components. Beginning electrical engineers learn all about the different types of components, since they are indeed the building blocks of all electronic circuitry, from simple to complex.

The following four types of components are such essential building blocks they can be found in almost any electrical circuit: the resistor, the capacitor, the transistor, and the diode. A diode is considered an essential building block since it assures that electricity flows in only an intended direction and not in an unintended direction. Without diodes, most electronic devices simply would not operate.

While diodes are indeed an essential part of most electronic devices, they are not without their problems. One such problem is that diodes typically require a forward voltage of approximately 0.7 Volts to operate, and diodes dissipates power in proportion to this forward voltage. While many household electronic devices such as televisions, microwave ovens, and the like that are powered by household voltage can tolerate the power loss of the diodes in the circuit, this power loss is not tolerated as well by battery powered electronic devices, such as calculators, tape players, hand-held video games, and portable computers. For these devices, this power loss directly translates into shorter battery life. This shorter battery life can directly impact the usability of the device.

One such attempt at making a low power diode is disclosed in U.S. Pat. No. 3,599,323. The diode in this patent is a hot carder diode specially fabricated by depositing vaporized chromium onto a prepared P-type silicon surface. Current flow is by the Schottky emission of hot holes from silicon over the relatively low barrier at the chromium-silicon interface. While the diode of this patent is able to reduce power loss by reducing the forward voltage from 0.7 Volts to approximately 0.3 Volts, it is expensive and complex to make. In addition, significant power is still lost from this diode even at a 0.3 volt forward voltage, making it undesirable for battery powered electronic devices or other devices with low power requirements.

SUMMARY OF THE INVENTION

A common dictionary definition of a "diode" is "any electronic device that restricts current flow chiefly to one direction." This definition covers not only the conventional two lead PN junction semiconductor device presently known in the prior art (referred to herein as a "conventional diode") but also the electronic device of this invention (referred to herein as a "low power diode"). A low power diode has a comparator for comparing the voltage present at the anode and cathode of the diode. When the comparator determines that the voltage present at the anode of the low power diode

2 equals or exceeds the voltage present at the cathode of the low power diode by a predetermined forward voltage, a signal is generated. This signal turns on a transistor acting as a switch, which in turn electronically connects the anode and the cathode of the low power diode together. Unlike conventional diodes that have a forward voltage (dependent on the physical silicon junction property of the diode) of approximately 0.7 Volts, this low power diode has a very small forward voltage (dependent on the drain to source resistance of the switch when on and the offset of the comparator) as low as 0.25 milliVolts.

DESCRIPTION OF THE DRAWINGS

FIG. 6A shows the graph of FIG. 3 in more detail, when the comparator of FIG. 5A is used.

DETAILED DESCRIPTION OF THE PREFERRED EMBODIMENT

Figure 1:
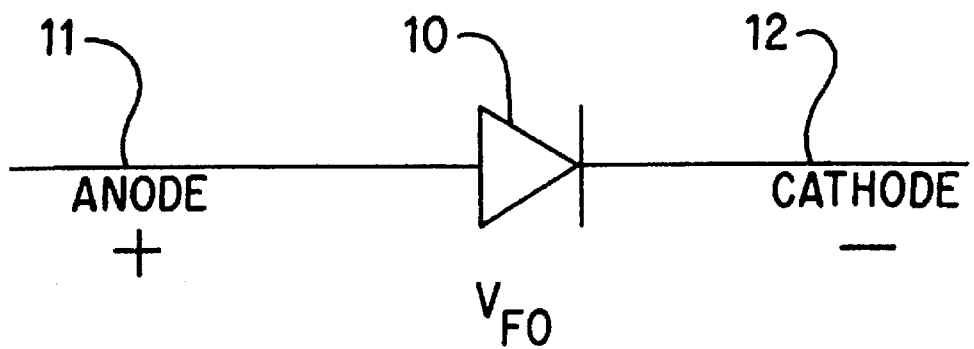
FIG. 1 shows a conventional diode.

FIG. 1 shows a conventional diode. Diode 10 has anode line 11 and cathode line 12. The forward voltage required to activate diode 10 so that current flows from anode line 11 to cathode line 12 is referred to as $V_{FO}$.

Figure 2:
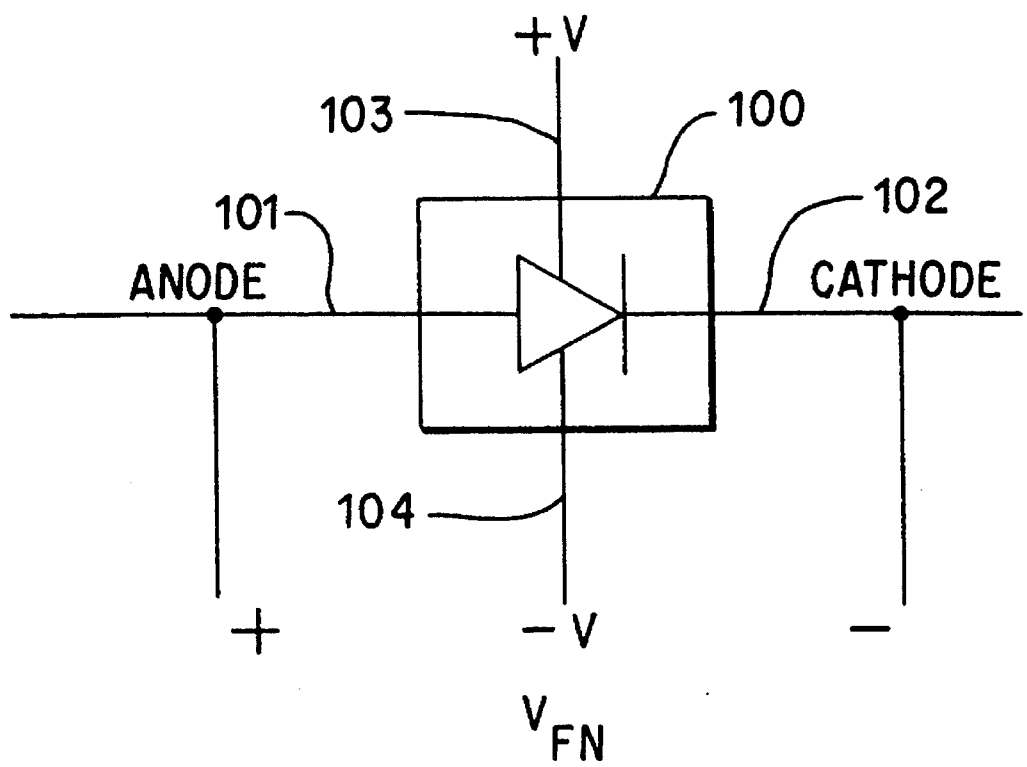
FIG. 2 shows a low power diode of the preferred embodiment of the invention.

FIG. 2 shows a low power diode of the preferred embodiment of the invention. Like diode 10, low power diode 100 has anode line 101 and cathode line 102. Unlike diode 10, low power diode 100 has two additional lines: voltage lines 103 and 104. The forward voltage required to activate low power diode 100 so that current flows from anode line 101 to cathode line 102 is referred to as $V_{FN}$.

Figure 3:
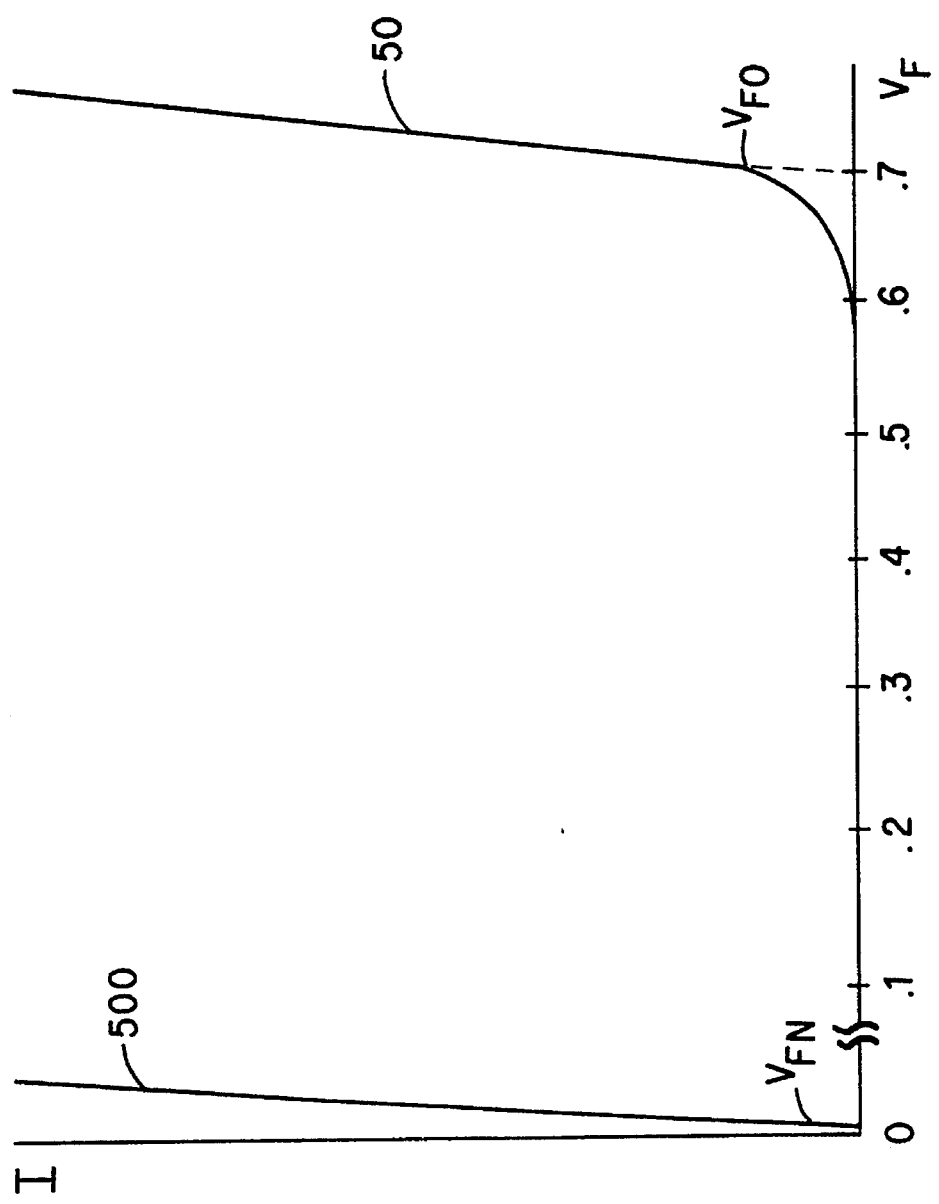
FIG. 3 shows a graph comparing the forward voltage characteristics of the conventional diode of FIG. 1 with the low power diode of FIG. 2.

FIG. 3 shows a graph comparing the forward voltage characteristics of the conventional diode of FIG. 1 with the low power diode of FIG. 2. Diode characteristic curve 50 corresponds to the operation of conventional diode 10, while diode characteristic curve 500 corresponds to the operation of low power diode 100. Curve 50 shows that current I is zero (i.e. does not flow—insignificant leakage current ignored)until $V_{FO}$ of diode 10 reaches approximately 0.7 Volts. At around 0.7 Volts, diode 10 turns on and allows current to flow between anode line 11 and cathode line 12.

Curve 500 shows that current I is zero (i.e. does not flow—insignificant leakage current ignored) until $V_{FN}$ of low power diode 100 reaches a very small forward voltage of approximately 0.25 milliVolts. At around 0.25 milliVolts, low power diode 100 turns on and allows current to flow between anode line 101 and cathode line 102.

Figure 4:
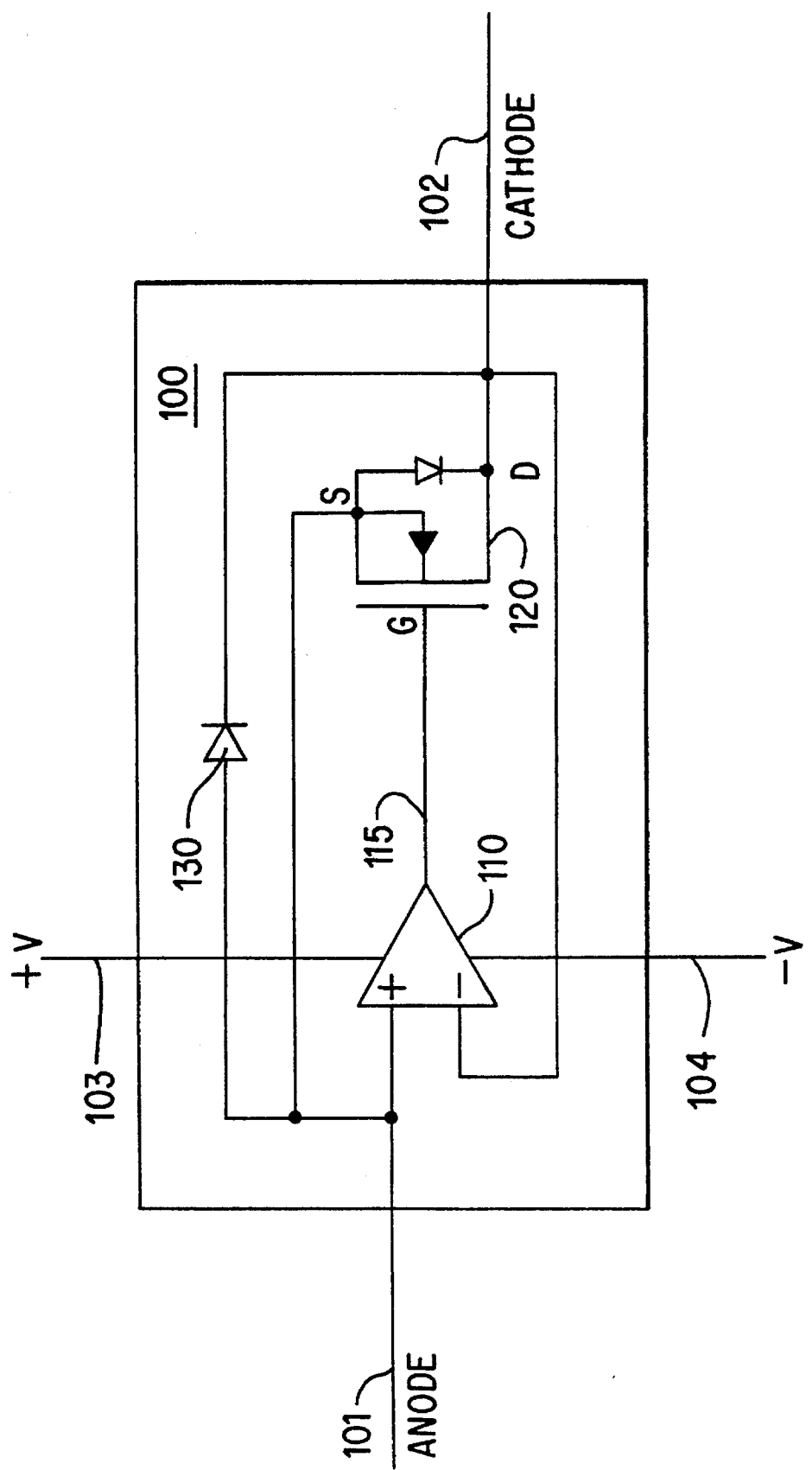
FIG. 4 shows the low power diode of the preferred embodiment of the invention in more detail.

FIG. 4 shows the low power diode of the preferred embodiment of the invention in more detail. Low power diode 100 contains comparator 110, switch 120, and diode 130. Comparator 110 is powered by voltage lines 103 and 104. In the preferred embodiment, voltage line 103 contains a voltage level of +V—typically +1.5 to +15.0 Volts. Voltage line 104 contains a voltage level of −V (i.e. −1.5 to −15.0 Volts), although voltage line 104 could also be at ground.

Comparator 110 has two inputs. Anode line 101 is connected to one input, and cathode line 102 is connected to the other input. When the voltage present at anode line 101 is less than or equal to the voltage present at cathode line 102 plus a predetermined forward voltage of approximately 0.25 milliVolts, comparator 110 outputs a logical low signal on output line 115. But when the voltage present at anode line 101 exceeds the voltage present at cathode line 102 by the predetermined forward voltage, comparator 110 outputs a logical high signal on output line 115.

In the preferred embodiment, switch 120 is an N-MOS FET transistor connected at its gate to output line 115, at its source to anode line 101, and at its drain to cathode line 102. For purposes of clarity and convenience, the terms "source", "gate", and "drain" shah refer to the three junctions of switch 120 regardless of whether switch 120 is a FET transistor, bipolar transistor, or other equivalent circuitry. In the preferred embodiment, switch 120 is an IRF1010 manufactured by the International Rectifier Corporation.

Switch 120 is in the "off" position when output line 115 from comparator 110 is at a logical low level. When switch 120 is off, anode line 101 and cathode line 102 are electronically isolated, and no current flows between the them. But when a logical high level signal is present on output line 115, switch 120 turns "on", and electronically connects anode line 101 with cathode line 102. This causes low power diode 100 to turn "on". As previously discussed, switch 120 turns on when the voltage present at anode line 101 is approximately 0.25 milliVolts higher than the voltage present at cathode line 102.

Referring again to FIG. 4, damping diode 130 is a conventional diode and is present in low power diode 100 to handle instances where the switching speed of comparator 110 and switch 120 is slower than the switching speed of the input signals on anode line 101. For example, if the input signals on anode line 101 go from low to high in 100 nS, and if the switching speed of comparator 110 and switch 120 is 1 µS, energy will be wasted between the time the input signal switches and comparator 110 and switch 120 switch, since the voltage $V_{FN}$ may overshoot desired levels during this delay period. Clamping diode 130 minimizes this energy loss by damping the amount of overshoot at one normal diode drop, or 0.7 Volts. Clamping diode 130 is not necessary if the switching speed of comparator 110 and switch 120 is faster than the switching speed of the input signals, or if the relatively small amount of power lost during this delay period is acceptable.

Figure 5A:
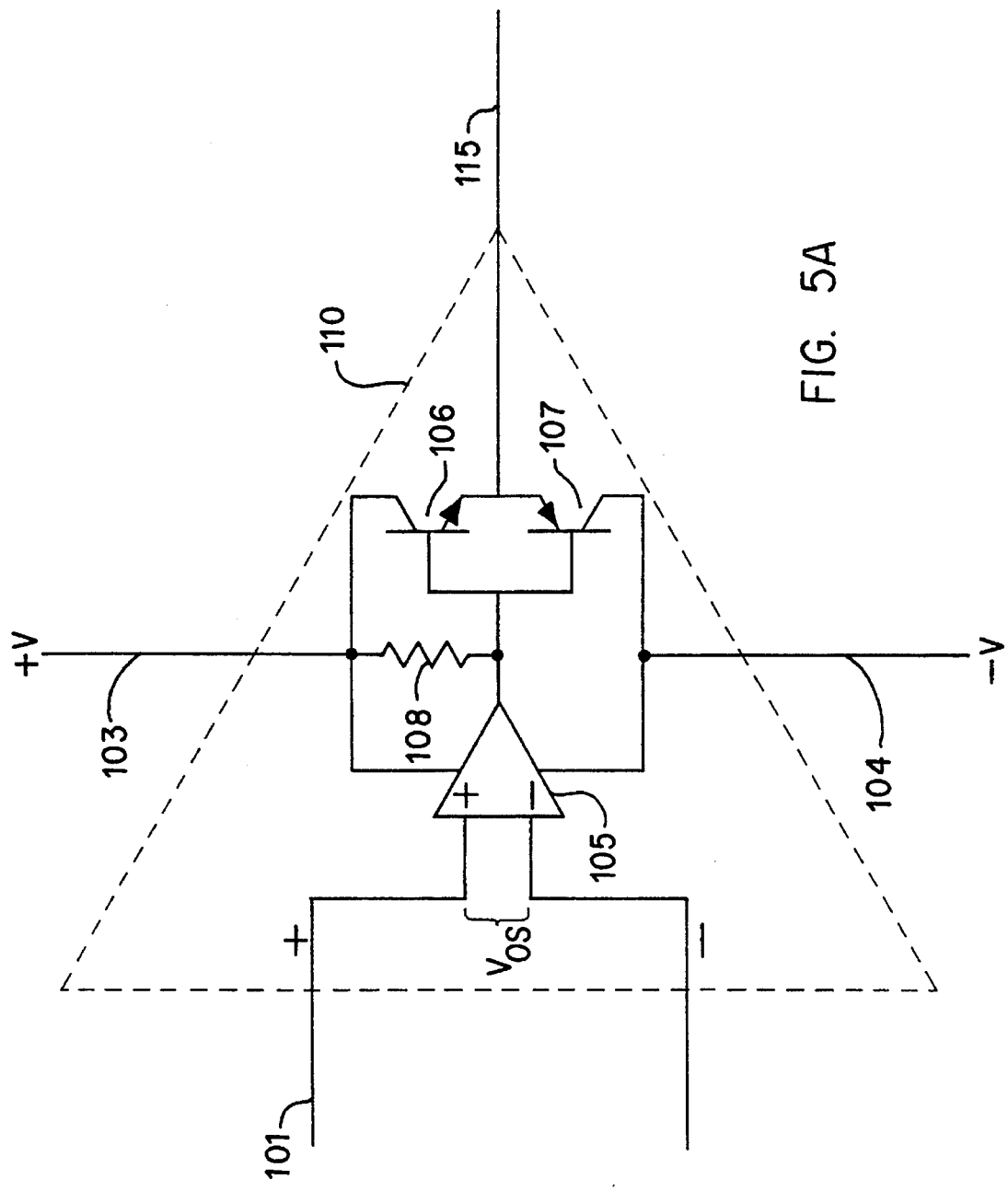
FIG. 5A shows a preferred comparator of the low power diode shown in FIG. 4 in more detail.

FIG. 5A shows the preferred comparator of the low power diode shown in FIG. 4 in more detail. Comparator 110 contains op amp 105, with a non-inverting buffer circuit made up of transistors 106 and 107 and pull-up resistor 108. In the preferred embodiment, op amp 105 is an OPA37 operational amplifier manufactured by the Burr-Brown Corporation. When the output of op amp 105 goes low, transistor 107 turns on and provides a solid path for line 115 to go low (through line 104) and not float. When the output of op amp 105 switches high, transistor 106 turns on and current flows from line 103 through transistor 106 to output line 115, thereby providing a solid path for output line 115 to go high and stay high.

When the comparator shown in FIG. 5A is used in the low power diode of FIG. 4, the low power diode can be referred to as a dynamic diode. A dynamic diode switches through the zero voltage crossing (i.e. goes from a negative voltage to a positive voltage) so rapidly that there is no time for the diode to oscillate around the zero crossing.

FIG. 6A shows the graph of FIG. 3 in more detail, when the comparator of FIG. 5A is used, and where op amp 105 is a OPA37 op amp with a natural offset $V_{OS}$ at the top of its range—0.25 milliVolts. As previously discussed in FIG. 3, diode characteristic curve 500 shows that current I is zero (i.e. does not flow) until $V_{FN}$ of low power diode 100 reaches a very small forward voltage of approximately 0.25 milliVolts, shown as point 520. At point 520, low power diode 100 turns on and allows current to flow between anode line 101 and cathode line 102. Unlike conventional diodes, where this forward voltage is a physical semiconductor property of the silicon junction of the diode, the forward voltage for low power diode 100 is predetermined by $V_{OS}$—the offset of op amp 105. At point 520, diode characteristic curve 500 jumps to point 530, and $V_{FN}=V_{DSON}$. $V_{DSON}$ is equal to the resistance between the drain and source of switch 102 when it is on ($R_{DSON}$), multiplied by the current that flows between the source and drain of switch 102 when it is on. The IRF1010 switch used in the preferred embodiment has a specified $R_{DSON}$ of 0.014 Ω. As $V_{FN}$ exceeds $V_{OS}$, as is shown on point 540 of FIG. 6A, low power diode 100 is on, and $V_{FN}$ continues to be equal to I * $R_{DSON}$. Those skilled in the art will appreciate that even lower values of $V_{DSON}$ will be achieved (i.e. the slope of $V_{FN}$ above point 530 will be steeper) as technology improves and lowers the value of $R_{DSON}$. In addition, those skilled in the art will appreciate that $R_{DSON}$ can be reduced if switch 102 is replaced by a plurality of switches connected in parallel.

While use of an N-MOS transistor is contemplated in the preferred embodiment, other devices could be used and still fall within the spirit and scope of the invention. For example, P-MOS, JFET, SenseFET or even low saturation bipolar transistors could be used. Use of these alternate devices may slightly alter the characteristics and terminology used to determine the forward voltage of the low power diode. For example, if a SenseFET is used, $V_{DSON}$ is determined by $R_{DSON}$ multiplied by $I_{SENSE}$.

Figure 5B:
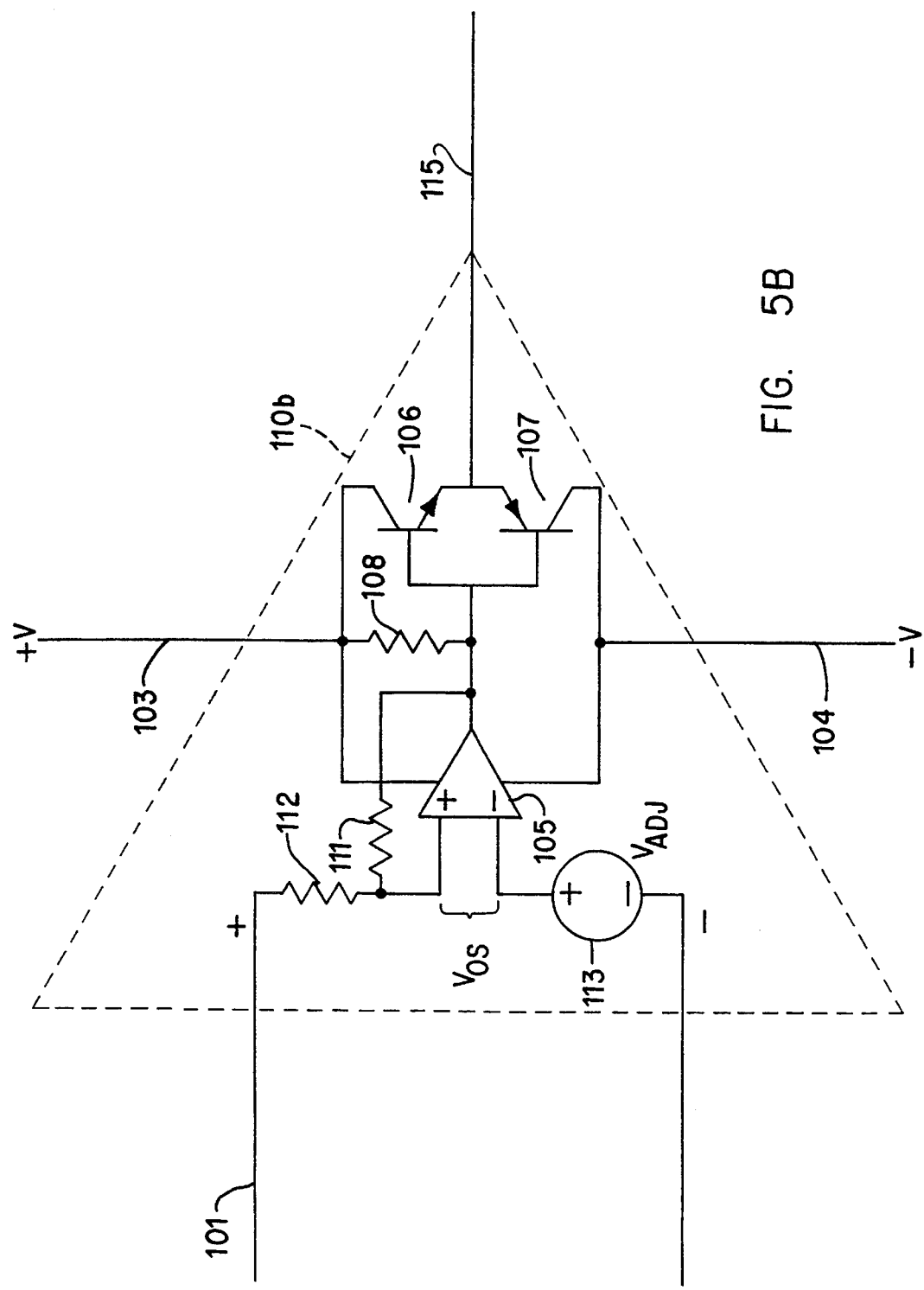
FIG. 5B shows an alternate comparator of the low power diode of FIG. 4 in more detail.

FIG. 5B shows an alternate comparator of the low power diode of FIG. 4 in more detail. Comparator 110b is just like comparator 110 of FIG. 5A, except for resistor pair 111 and 112, and adjustment voltage source 113. When the comparator shown in FIG. 5B is used in the low power diode of FIG. 4, the low power diode can be referred to as a general purpose diode. Since a general purpose diode may switch through the zero voltage crossing slowly, undesirable oscillation may occur. Resistor pair 111 and 112 creates hysterysis to avoid this oscillation problem. The natural offset of op amp 105 is referred to as $V_{OS}$ and typically varies in a range from a small negative to a small positive voltage. The amount of this offset range is typically larger for more inexpensive comparators, and can be reduced to near zero flop amp 105 is trimmed. Adjustment voltage source 113 is a conventional voltage source used in this circuit to provide a known positive voltage to insure that the combination of $V_{ADJ}$ and $V_{OS}$ is positive, so that conduction in reverse bias mode is avoided.

Figure 6B:
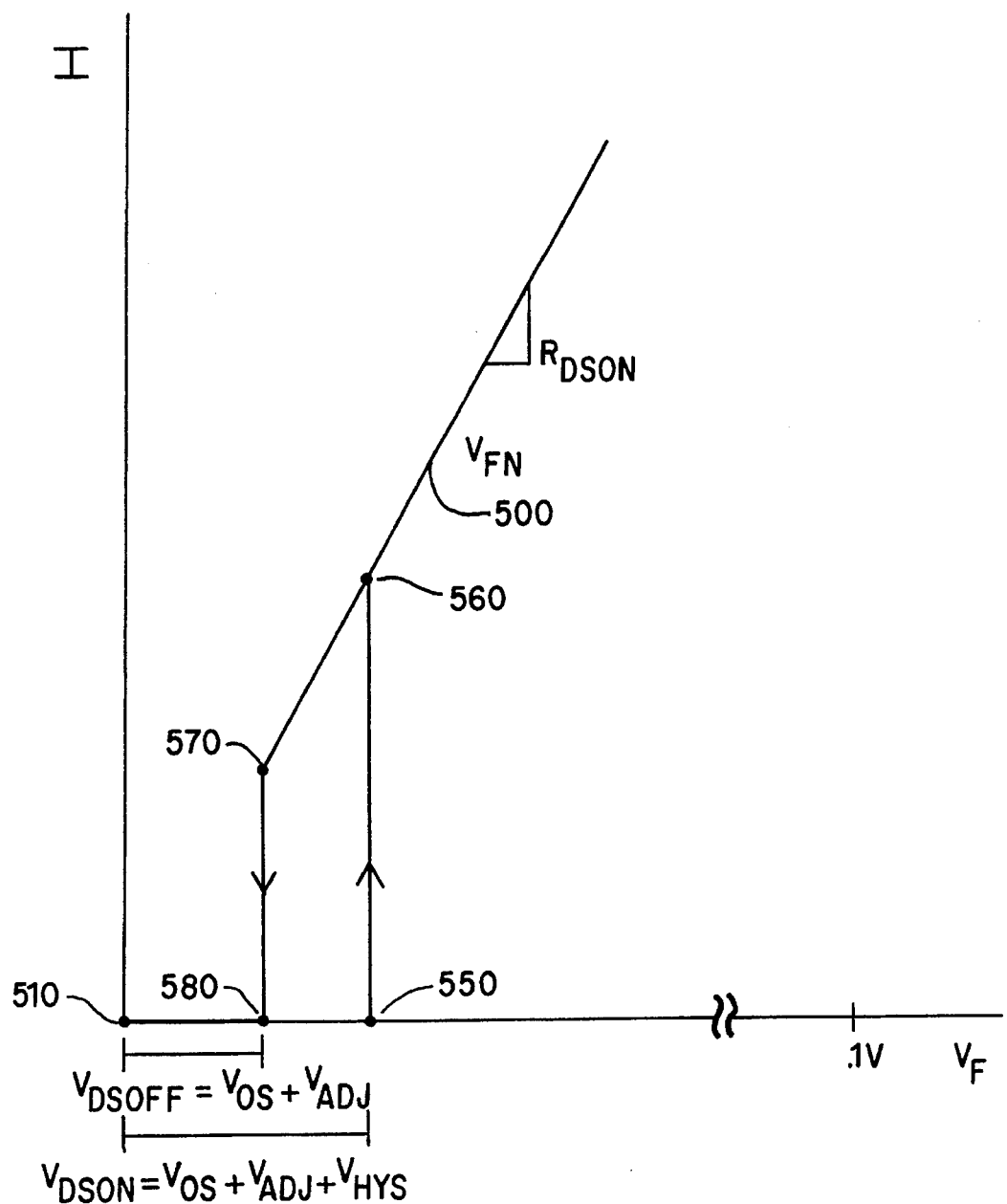
FIG. 6B shows the graph of FIG. 3 in more detail, when the comparator of FIG. 5B is used.

FIG. 6B shows the graph of FIG. 3 in more detail, when the comparator of FIG. 5B is used. Like FIG. 6A, the forward voltage is determined by $R_{DSON}$ above point 560. But diode 100 does not turn on until the forward voltage equals or exceeds $V_{OS}+V_{ADJ}$ (natural offset of op amp 105+adjustment voltage source 113)+$V_{HYS}$ (hysterysis voltage due to the effect of resistors 112 and 113). This is shown at point 550. Diode 111 turns off when the forward voltage is less than or equal to $V_{OS}+V_{ADJ}$. This is shown at point 580.

In the preferred embodiment, low power diode 100 is fabricated as a VLSI chip having four leads corresponding to lines 101–104 using conventional manufacturing techniques, although an equivalent circuit could be built out of off the shelf devices if space were not a concern and production volumes would not justify such a fabrication. In addition, a hybrid chip and wire component could be used to optimize characteristics of the comparator and switch separately, using different technologies where appropriate.

What is claimed is:

1. A low power diode having an anode and cathode, said low power diode comprising:

a comparator having a first input, a second input, and an output, said comparator connected at said first input to said anode of said low power diode, said comparator connected at said second input to said cathode of said low power diode, said comparator for comparing a first voltage present at said first input with a second voltage present at said second input and outputting a signal at said output if said first voltage present at said first input is greater than said second voltage present at said second input; and a switch connected at a first junction to the output of said comparator, connected at a second junction to said anode of said low power diode and connected at a third junction to said cathode of said low power diode, said switch for switching said low power diode-such that said anode of said low power diode and said cathode of said low power diode become electronically connected, said switching responsive to the detection of a signal at said first junction from said output of said comparator, said switch operating when said first voltage present at said first input of said comparator exceeds said second voltage present at said second input of said comparator by a natural offset voltage of said comparator, wherein the forward voltage of said low power diode when on is the resistance between said second and third junctions of said switch when on multiplied by the current flowing through said switch when on.

2. The low power diode of claim 1, wherein said switch is a field effect transistor.

3. The low power diode of claim 1, further comprising:

a clamping diode having an anode and a cathode, said clamping diode connected at its anode to the anode of said low power diode and at its cathode to the cathode of said low power diode.

4. The low power diode of claim 1, wherein said switch operates when said first voltage present at said first input of said comparator exceeds said second voltage present at said second input of said comparator by said natural offset voltage of said comparator plus a hysterysis voltage.

* * * * *